US008956892B2

(12) United States Patent
Lam et al.

(10) Patent No.: US 8,956,892 B2
(45) Date of Patent: Feb. 17, 2015

(54) METHOD AND APPARATUS FOR FABRICATING A LIGHT-EMITTING DIODE PACKAGE

(75) Inventors: Kui Kam Lam, Hong Kong (CN); Ka Yee Mak, Hong Kong (CN); Yiu Yan Wong, Hong Kong (CN); Ming Li, Hong Kong (CN)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/347,388

(22) Filed: Jan. 10, 2012

(65) Prior Publication Data

US 2013/0178002 A1 Jul. 11, 2013

(51) Int. Cl.
*H01L 33/50* (2010.01)
(52) U.S. Cl.
USPC .............. 438/27; 257/99; 257/100; 257/676; 257/E33.062; 257/E33.066
(58) Field of Classification Search
USPC ........................ 438/27, 26, 64, 99, 127, 494
See application file for complete search history.

(56) References Cited

U.S. PATENT DOCUMENTS

| 6,518,600 | B1 * | 2/2003 | Shaddock | 257/98 |
| 2010/0112734 | A1 * | 5/2010 | Koizumi et al. | 438/27 |
| 2010/0159787 | A1 * | 6/2010 | Iijima et al. | 445/25 |
| 2012/0122250 | A1 * | 5/2012 | Ji et al. | 438/15 |
| 2012/0190136 | A1 * | 7/2012 | Hong | 438/7 |
| 2013/0056774 | A1 * | 3/2013 | Hong et al. | 257/98 |

FOREIGN PATENT DOCUMENTS

KR 10-2010-0114128 * 11/2010 .................. 438/15

* cited by examiner

*Primary Examiner* — Benjamin Sandvik
*Assistant Examiner* — Rodolfo Fortich
(74) *Attorney, Agent, or Firm* — Sughrue Mion, PLLC

(57) ABSTRACT

Disclosed is a method of fabricating a light-emitting diode package, which comprises a light-emitting chip operative to emit light of a first wavelength range. The method comprises the steps of: dispensing a photoluminescent mixture on the light-emitting chip, the photoluminescent mixture being capable of absorbing a portion of light of the first wavelength range emitted from the light-emitting chip to re-emit light of a second wavelength range; partially curing the photoluminescent mixture by heating the photoluminescent mixture to a pre-curing temperature and then cooling the photoluminescent mixture to below the pre-curing temperature; and fully curing the photoluminescent mixture to harden the photoluminescent mixture. An apparatus for fabricating a light-emitting diode package is also disclosed.

18 Claims, 6 Drawing Sheets

METHOD AND APPARATUS FOR FABRICATING A LIGHT-EMITTING DIODE PACKAGE

TECHNICAL FIELD OF THE INVENTION

This invention relates to a method and apparatus for fabricating a light-emitting diode package comprising a light-emitting chip.

BACKGROUND OF THE INVENTION

Generally a light-emitting diode (LED) package comprises a carrier (e.g. a leadframe), an LED chip disposed on a surface of the carrier, and an electrically-conductive wire for connecting the LED chip to the carrier. Each type of LED chip is only capable of emitting radiation of a narrow wavelength range in the frequency range of visible light within the electromagnetic spectrum—specifically, blue LED chips only emit radiation of a narrow wavelength range of around 450-475 nm that is normally perceived as 'blue' light; red LED chips only emit radiation of a narrow wavelength range of around 620-740 nm that is normally perceived as 'red' light; and green LED chips only emit radiation of a narrow wavelength range of around 520-570 nm that is normally perceived as 'green' light. In order to emit radiation of a wider wavelength range, an LED package may include a photoluminescent mixture comprising a photoluminescent material capable of absorbing a portion of the radiation of a certain wavelength range emitted from an LED chip and re-emitting radiation of a different wavelength range. The radiation re-emitted from the photoluminescent mixture then combines with the unabsorbed portion of the radiation emitted from the LED chip to emit radiation of a desired wavelength range. For instance, an LED package—which is capable of emitting perceived 'white' light—comprises a photoluminescent mixture having a photoluminescent material, such as phosphor, that absorbs a portion of blue light emitted from an LED chip to re-emit yellow light. The yellow light re-emitted from the photoluminescent mixture then combines with the unabsorbed blue light emitted from the LED chip to emit the perceived 'white' light from the LED package.

A problem in using a photoluminescent mixture to fabricate LED packages is the material changes of the photoluminescent mixture that affect the wavelength range of the re-emitted radiation. Such material changes of the photoluminescent mixture relate to the settling effect of the photoluminescent material in the photoluminescent mixture towards the bottom of the LED chip, which affect the ability of the photoluminescent mixture to absorb a desired amount of radiation emitted from the LED chip. This consequently affects the desired amount of radiation to be re-emitted from the photoluminescent mixture such that light of a desired colour is not emitted from the fabricated LED packages.

Thus it is an object of the present invention to seek to reduce the material changes of a photoluminescent mixture, so that the wavelength range of light that finally emits from an LED package comprising the photoluminescent mixture is more consistent to produce the desired colour.

SUMMARY OF THE INVENTION

A first aspect of the invention is a method of fabricating an LED package, which comprises a light-emitting chip operative to emit light of a first wavelength range. The method comprises the steps of: dispensing a photoluminescent mixture on the light-emitting chip, the photoluminescent mixture being capable of absorbing a portion of light of the first wavelength range emitted from the light-emitting chip to re-emit light of a second wavelength range; partially curing the photoluminescent mixture by heating the photoluminescent mixture to a pre-curing temperature and then cooling the photoluminescent mixture to below the pre-curing temperature; and fully curing the photoluminescent mixture to harden the photoluminescent mixture.

By partially curing the photoluminescent mixture which involves heating the photoluminescent mixture after it has been dispensed on the light-emitting chip to the pre-curing temperature, the settling effect of the photoluminescent material in the photominescent mixture towards the bottom of the light-emitting chip is prevented, or at least reduced, so that the photoluminescent mixture is capable of absorbing a desired amount of light of the first wavelength as emitted from the light-emitting chip and re-emitting a desired amount of light of the second wavelength range, so that the correlated colour temperature (CCT) of light emitted from the fabricated LED package will advantageously correspond to the desired CCT of light.

Some optional steps of the first aspect of the invention are defined in the dependent claims.

For instance the step of partially curing the photoluminescent mixture may include the step of ramping up the temperature of the photoluminescent mixture to the pre-curing temperature of 90° C. at a rate of between 0.1° C./s and 15° C./s. The faster it takes to ramp up the temperature of the photoluminescent mixture to the pre-curing temperature, the more reduced will be the settling effect of the photoluminescent material in the photoluminescent mixture towards the bottom of the light-emitting chip, and thus, the closer will be the CCT of light emitted from the LED packages to the desired CCT of light.

Further the method of fabricating the LED package may comprise the step of maintaining the photoluminescent mixture at the pre-curing temperature after the photoluminescent mixture is heated to the pre-curing temperature.

Moreover the method of fabricating the LED package may further comprise the steps of storing a plurality of carriers in a storage device, wherein each carrier has a plurality of the light-emitting chips with partially cured photoluminescent mixtures; and heating the storage device with the plurality of carriers to fully cure the partially cured photoluminescent mixtures.

A second aspect of the invention is an apparatus for fabricating a light-emitting diode package, which comprises a light-emitting chip operative to emit light of a first wavelength range. The apparatus comprises: a dispenser for dispensing a photoluminescent mixture on the light-emitting chip, the photoluminescent mixture being capable of absorbing a portion of light of the first wavelength range emitted from the light-emitting chip to re-emit light of a second wavelength range; a first heating device for partially curing the photoluminescent mixture; and a second heating device for fully curing the partially cured photoluminescent mixture to harden the photoluminescent mixture.

By providing the first heating device for partially curing the photoluminescent material dispensed on the light-emitting chip, the settling effect of the photoluminescent material in the photoluminescent mixture can be at least reduced, so that the photoluminescent mixture is capable of absorbing a desired amount of light of the first wavelength as emitted from the light-emitting chip and re-emitting a desired amount of light of the second wavelength range. Advantageously, the CCT of light emitted from the fabricated LED package will advantageously correspond to the desired CCT of light.

Some optional features of the second aspect of the invention are also defined in the dependent claims. For instance, the apparatus may further comprise a storage device for storing a plurality of carriers, each carrier having a plurality of the light-emitting chips with partially cured photoluminescent mixtures, wherein the second heating device is operable to heat the storage device to fully cure the partially cured photoluminescent mixtures.

BRIEF DESCRIPTION OF THE DRAWINGS

Embodiments of the invention will now be described, by way of example only, with reference to the accompanying drawings, of which:

FIG. 4a shows the heating device of the apparatus of FIG. 2, while

DETAILED DESCRIPTION OF THE PREFERRED EMBODIMENTS

Figure 1:
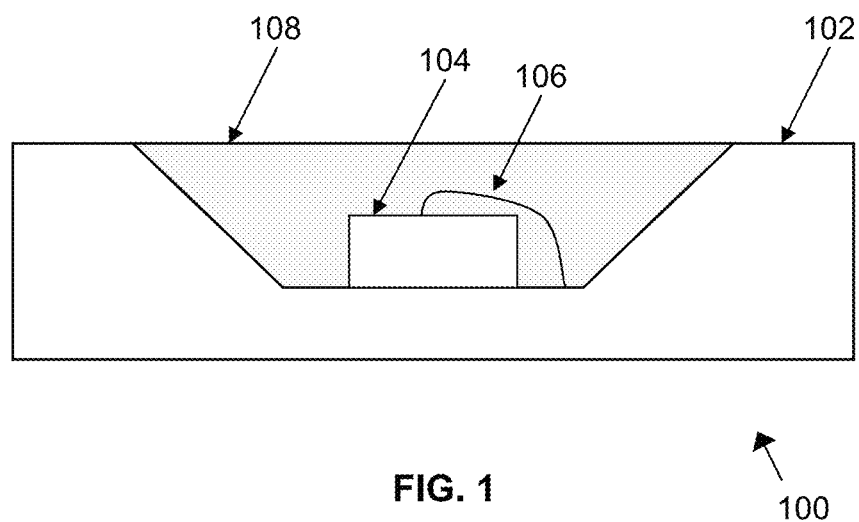
FIG. 1 shows an embodiment of a fabricated LED package.

FIG. 1 shows an embodiment of a fabricated LED package 100 comprising: i) a carrier (shown in FIG. 1 as a leadframe 102); ii) an light-emitting chip 104 disposed on a surface of a cavity of the leadframe 102; iii) a wire 106 that electrically connects the light-emitting chip 104 to the leadframe 102; and iv) a fully cured photoluminescent layer 108 in the cavity of the leadframe 102.

Figure 2:
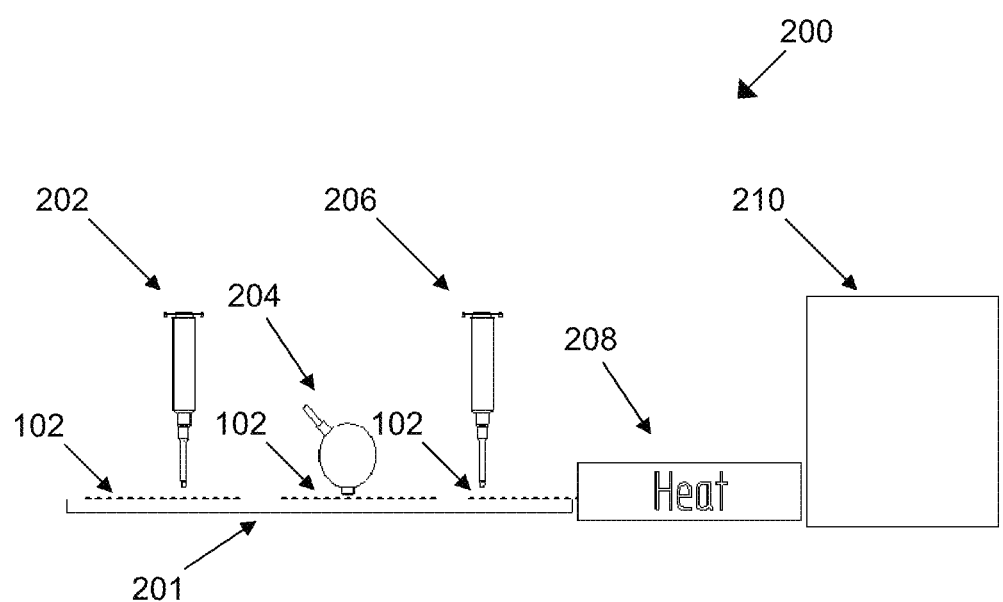
FIG. 2 shows part of an apparatus for fabricating the LED package of FIG. 1, the apparatus comprising a heating device.

FIG. 2 shows an apparatus 200 for fabricating LED packages 100. The apparatus 200 comprises: i) a conveying device 201 for conveying a plurality of leadframes 102 across the apparatus 200, each leadframe 102 having an array of raw LED packages (i.e. LED packages without the fully cured photoluminescent layer 108); ii) a first dispenser 202 for dispensing a photoluminescent mixture of a first predefined concentration into the cavities of the plurality of leadframes 102 and on the respective LED chips 104 of the raw LED packages; ii) a correlated colour temperature (CCT) tester 204 capable of testing one or more characteristics of light; iii) a second dispenser 206 for dispensing a photoluminescent mixture of a second predefined concentration into the cavities of the plurality of leadframes 102 and on the respective LED chips 104 of the raw LED packages, wherein the second predefined concentration is lower than the first predefined concentration; iv) a heating device (shown in FIG. 2a as a heating tunnel 208) for partially curing the photoluminescent mixture in the respective cavities of the leadframes 102; and v) a storage device (shown as a magazine 210) for storing a plurality of leadframes 102.

Specifically the photoluminescent mixtures in the first and second dispensers 202, 206 are formed by mixing phosphor powder with a polymer (or glue) such as silicone. By mixing appropriate quantities of phosphor power with silicone, the photoluminescent mixtures of the first and second predefined concentrations can be produced.

The CCT tester 204 comprises a probing device with programmable electrical parameters and is capable of lighting up a selected LED package 100, and an optical sensor capable of detecting the CCT of light emitted from an array of LED packages 100. The detected CCT is then compared by a controller against a desired CCT of light to determine the amount of photoluminescent mixture that the second dispenser 204 should dispense to compensate for the difference between the detected CCT and the desired CCT of light.

Figure 3:
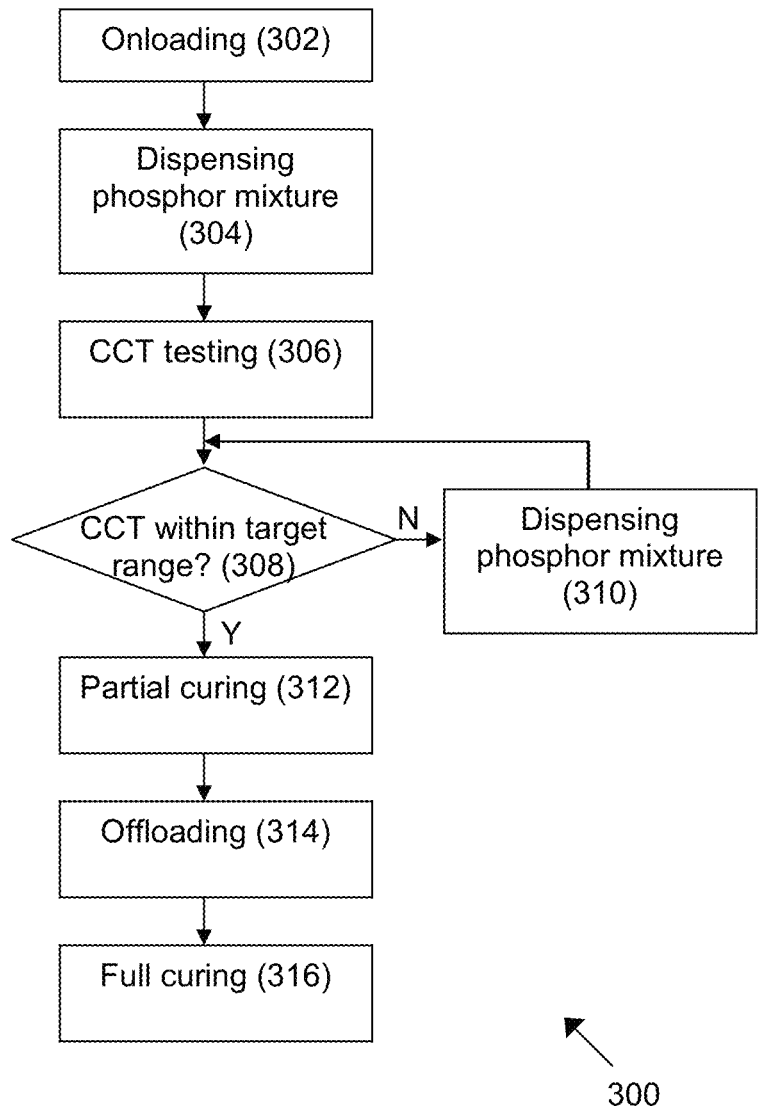
FIG. 3 is a flow chart showing the steps of fabricating an LED package by the apparatus of FIG. 2.

FIG. 3 is a flowchart 300 showing the steps of fabricating LED packages 100 using the apparatus 200. First the leadframes 102 are onloaded 302 sequentially onto the conveying device 201 and conveyed to the first dispenser 202. The first dispenser 202 accordingly dispenses 304 the photoluminescent mixture of the first predefined concentration into the cavities of each onloaded leadframe 102 before the leadframe 102 is conveyed by the conveying device 201 to the CCT tester 204. The CCT tester 204 is then activated to test 306 the light emitted from the corresponding array of raw LED packages arranged on each onloaded leadframe 102.

It should be appreciated that the CCT tester 204 may be an optical sensor or any other measurement sensor capable of detecting one or more characteristics of light emitted from the array of raw LED packages. For instance the CCT tester 204 may be a charge coupled device (CCD) or a colorimeter that detects the CCT of light emitted from the array of raw LED packages. Alternatively, the CCT tester 204 may be a spectrometer.

In particular the CCT tester 204 is connected to a controller that compares the detected CCT with a desired CCT of light so as to determine 308 whether the detected CCT is within an acceptable range from the desired CCT. If the detected CCT is not within an acceptable range from the desired CCT of light, the controller accordingly determines the additional quantity of photoluminescent mixture of the second predefined concentration that should be further dispensed into the cavities of the onloaded leadframe 102 by the second dispenser 206 to achieve the desired CCT of light. Otherwise, no additional quantity of photoluminescent mixture of the second predefined concentration is required to be dispensed by the second dispenser 206. Hence the lower concentration of the photoluminescent mixture dispensed by the second dispenser 206 as compared with the first dispenser 202 allows the concentration of the photoluminescent mixture in the cavities of the leadframe 102 to be adjusted within the acceptable range from the desired CCT of light.

Nonetheless, it should be appreciated that the concentration of the photoluminescent mixture dispensed by the second dispenser 206 may also be higher than the concentration of the photoluminescent mixture dispensed by the first dispenser 202.

The leadframes 102 are then conveyed to the second dispenser 206. If the CCT of light emitted from the array of raw LED packages is not within the acceptable range from the desired CCT of light, the second dispenser 206 accordingly dispenses 310 the additional quantity of photoluminescent mixture of the second predefined concentration into the respective cavities of the onloaded leadframe 102 to achieve the desired CCT of light. Otherwise, the array of raw LED packages will not require any additional quantity of photoluminescent mixture of the second predefined concentration from the second dispenser 206.

The leadframes 102 are then conveyed to the heating tunnel 208 where it is subject to partial curing 312. The step of partial curing 312 involves heating the photoluminescent mixture to a pre-curing temperature. Specifically the photoluminescent mixture is partially cured through cross-linking of the polymer chains of the photoluminescent mixture by heat. More importantly, the step of partial curing 312 the photoluminescent mixture should be distinguished from a full curing process—the step of partially curing 312 the photoluminescent mixture does not result in a complete hardening of the photoluminescent mixture in the sense that there will still be some polymer chains of the photoluminescent mixture that have not been cross-linked at the end of the partial curing process. Accordingly, the partially cured photoluminescent mixture will still undergo further chemical reactions at the end of the partial curing process given suitable curing conditions such as heat. In contrast, full curing of the photoluminescent mixture ensures that the photoluminescent mixture in the cavity of the leadframe 102 is completely hardened in the sense that all of the polymer chains of the photoluminescent mixture have been cross-linked, as the photoluminescent mixture becomes stable without undergoing further chemical reactions at the end of the full curing process.

After the step of partial curing 312 of the photoluminescent material, the leadframe 102 is then offloaded 314 from the heating tunnel 208 and stored in the magazine 210. After a batch of a plurality of leadframes 102 have been stored in the magazine 210, the magazine 210 is then transported to an oven where the batch of the plurality of leadframes 102 is fully cured 316. Specifically the step of fully curing 316 of the leadframes 102 again involves applying heat, but in contrast to the previous step of partial curing 312, the step of fully curing 316 the leadframes 102 completely hardens the photoluminescent mixture in the cavities of the leadframes 102. Also, the full curing process takes a longer time than the partial curing process. For instance, a full curing process of the photoluminescent mixture may take between 1-3 hours whereas a partial curing process of the same may only take a few tens of seconds to a few minutes (e.g. ten minutes).

It should be appreciated that the apparatus 200 may be configured to perform further iterations of the steps of testing 306 and determining 308 the CCT of light emitted from the array of raw LED packages, and dispensing 310 additional quantity of photoluminescent mixture of the second predefined concentration into the cavities of the onloaded leadframe 102 to improve the accuracy of the desired CCT of light to be emitted from the fabricated LED packages.

The present inventors have found that by partially curing the photoluminescent mixture immediately after it has been dispensed into the cavities of the leadframe 102, the settling effect of the photoluminescent material in the photoluminescent mixture can be significantly reduced. Consequently the CCT of light emitted from the LED packages after full curing of the photoluminescent mixture advantageously corresponds to the desired CCT. In contrast, without the step of partially curing 312 the photoluminescent mixture, the idling time between the steps of dispensing the photoluminescent mixture and fully curing the photoluminescent mixture (typically around an hour, sometimes more) often results in the settling of the photoluminescent material of the photoluminescent mixture towards the bottom of the light-emitting chip 104, thereby affect the ability of the photoluminescent mixture to absorb a desired portion of the radiation emitted by the light-emitting chip 104 and to accordingly re-emit a desired portion of radiation of a different wavelength range. Consequently light that is emitted from the corresponding LED package may not be of a desired colour.

Figure 4A:
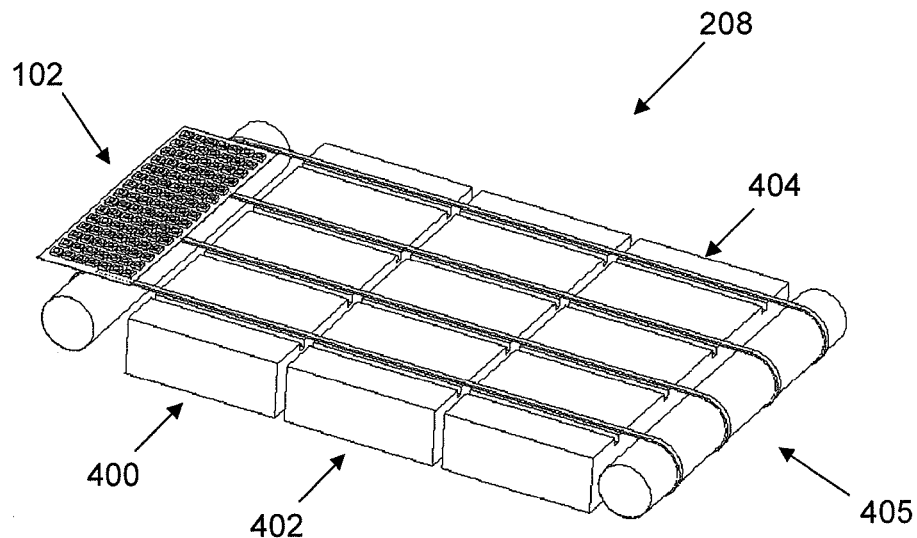
Figure 4B:
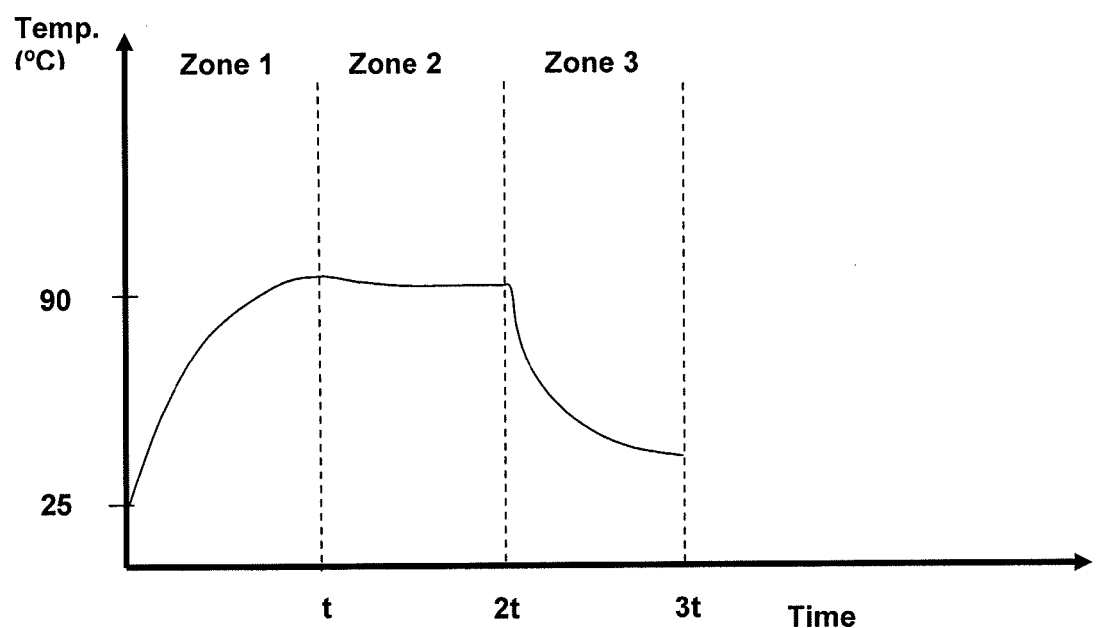
FIG. 4b shows a temperature profile of a photoluminescent mixture in the LED package during fabrication.

FIG. 4a shows the heating tunnel 208 of the apparatus 200, while FIG. 4b shows a temperature profile of the photoluminescent mixture as it undergoes the step of partial curing 312 in the heating tunnel 208 of FIG. 4a.

Specifically the heating tunnel 208 comprises a plurality of zones, namely: i) first and second heating zones 400, 402; ii) a cooling zone 404; and iii) a conveying device 405 for conveying a lead frame 102 comprising an array of LED packages across the heating zones 400, 402 and the cooling zone 404. During operation, the first and second heating zones 400, 402 are heated to their respective temperatures. Since the first heating zone 400 is for ramping up the temperature of the photoluminescent mixture, it should have a temperature higher than a pre-curing temperature of around 90° C. For instance the first heating zone 400 may have a temperature of between 150° C. and 300° C. (e.g. 200° C.). Accordingly, when the leadframe 102 comprising an array of partially cured LED packages is conveyed through the first heating zone 400, the temperature of the photoluminescent mixture is ramped up from the standard room temperature of around 25° C. to the pre-curing temperature of around 90° C. It should be appreciated that other pre-curing temperature of between 80° C.-130° C. may also be equally suitable for the pre-curing process.

The present inventors have also found that the faster it takes to ramp up the temperature of the photoluminescent mixture to the pre-curing temperature, the more reduced will be the settling effect of the photoluminescent material in the photoluminescent mixture towards the bottom of the light-emitting chip 104, and the closer will be the CCT of light emitted from the LED packages to the desired CCT of light. The rate at which the temperature of the photoluminescent mixture is ramped up to the pre-curing temperature may be between 0.1° C./s and 15° C./s. Evidently, the rate at which the temperature of the photoluminescent mixture is ramped up to the pre-curing temperature would also depend on the time it takes for each leadframe 102 to be conveyed across the first heating zone 400. For instance, if it takes 30 seconds for each leadframe 102 to be conveyed across the first heating zone 400, then the rate at which the temperature of the photoluminescent mixture should be ramped up to the pre-curing temperature of 90° C. would be about 2° C./s.

As the leadframe 102 is conveyed across the second heating zone 402 through the heating tunnel 208, the temperature of the photoluminescent mixture is maintained at 90° C., as shown in FIG. 4b. Specifically the temperature of the second heating zone 402 should be around the pre-curing temperature of 90° C. in order to maintain the temperature of the photoluminescent mixture at that pre-curing temperature. The photoluminescent mixture may take around 30 seconds to be conveyed across the second heating zone 402, and thus, the temperature of the photoluminescent mixture would be maintained at 90° C. for the same time period. As the leadframe 102 is conveyed across the cooling zone 404 through the heating tunnel 208, the photoluminescent mixture is accordingly cooled to below the pre-curing temperature. The photoluminescent mixture may take around another 30 seconds to cool to below the pre-curing temperature.

FIGS. 5a-5d show a leadframe 102 comprising an array of LED packages being conveyed across the heating tunnel 208 of FIG. 4a.

Figure 5A:
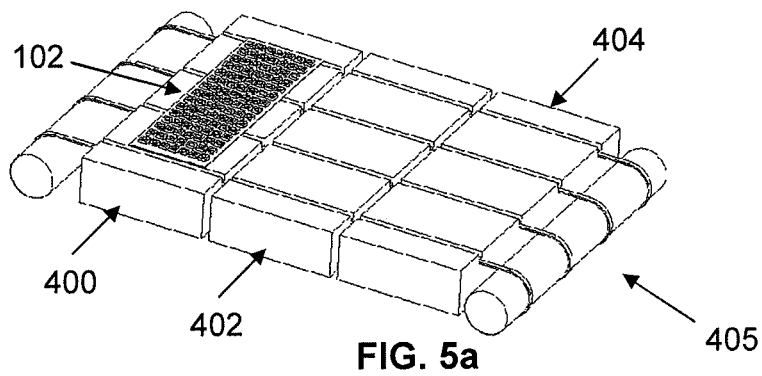
FIGS. 5a-5d show a leadframe being conveyed across the heating device of FIG. 4a during fabrication, the leadframe comprising an array of LED packages.
Figure 5B:
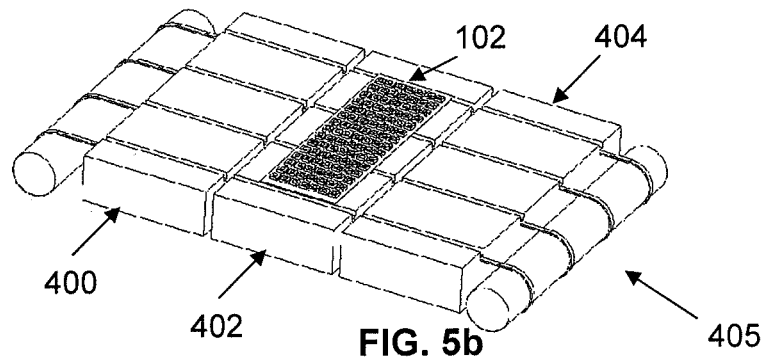
Figure 5C:
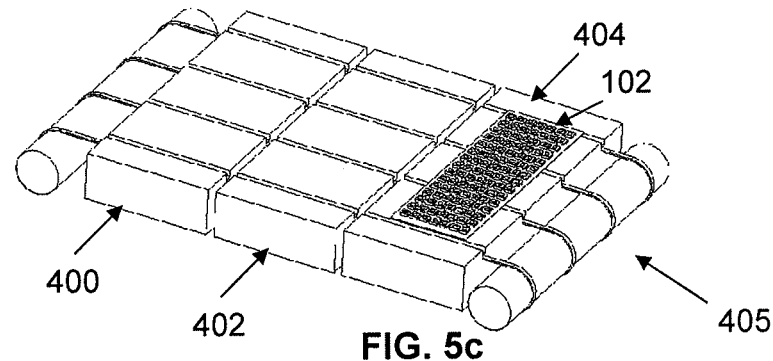
Figure 5D:
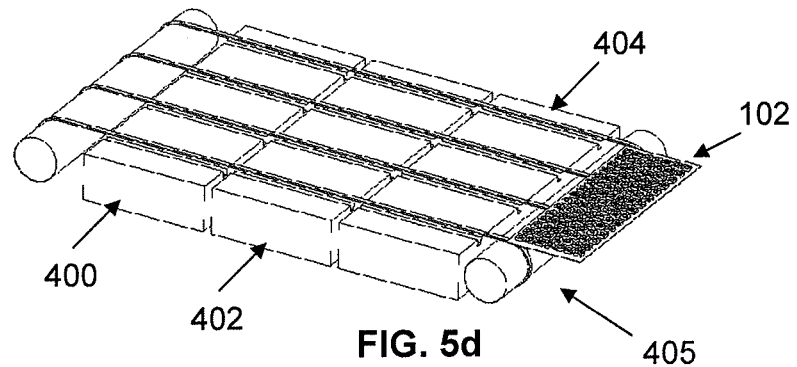

FIG. 5a shows the leadframe 102 in the first heating zone 400 where the temperature of the photoluminescent mixture is ramped up to the pre-curing temperature. FIG. 5b shows the leadframe 102 in the second heating zone 402 where the temperature of the photoluminescent mixture is maintained the pre-curing temperature. FIG. 5c shows the leadframe 102 in the cooling zone 404 where the temperature of the photoluminescent mixture is cooled to below the pre-curing temperature. Finally, FIG. 5d shows the leadframe 102 being offloaded from the heating tunnel 208.

Specifically the heating tunnel 208 is configured to convey the leadframe 102 continuously from the first heating zone 400 onward to the second heating zone 402, and finally across the cooling zone 404 during the entire pre-curing process of the photoluminescent mixture. However the heating tunnel 208 may also be configured such that the leadframe 102 remains stationary in the respective zones 400, 402, 404 as the photoluminescent mixture undergoes the pre-curing process.

Figure 6:
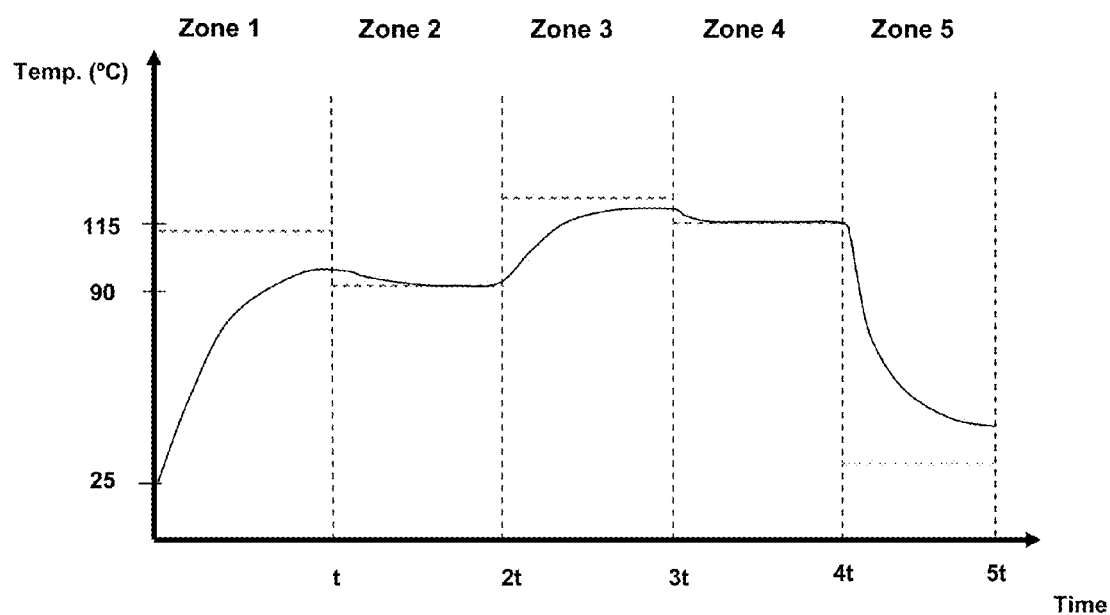
FIG. 6 shows an alternative temperature profile of the photoluminescent mixture in the LED package during fabrication.

It should be appreciated that other temperature profiles of the photoluminescent mixture may be used for its partial curing process. For instance FIG. 6 shows an alternative temperature profile of the photoluminescent mixture that additionally involves heating the photoluminescent mixture to a second pre-curing temperature of 115° C. and maintaining the photoluminescent mixture at the second pre-curing temperature, before cooling the photoluminescent mixture to below the second pre-curing temperature. For instance, the rate at which the temperature of the photoluminescent mixture is ramped up to the second pre-curing temperature may be between 0.1° C./s and 15° C./s. For this alternative temperature profile, the heating tunnel 208 may be adapted to include five zones comprising four heating zones and one cooling zone. While it has been described that the second pre-curing temperature is 115° C., it should be appreciated that the second pre-curing temperature may be any temperature between 100° C.-130° C.

Other embodiments may also be possible without departing from the scope of the present invention. For instance, the heating tunnel 208 may include just a single heating zone instead of separate heating zones for the partial curing of the photoluminescent mixture. Moreover, other photoluminescent material may be used in place of phosphor powder to produce the photoluminescent mixture.

The invention claimed is:

1. A method of fabricating a light-emitting diode package, the light-emitting diode package comprising a light-emitting chip operative to emit light of a first wavelength range, the method comprising the steps of:

dispensing a photoluminescent mixture on the light-emitting chip, the photoluminescent mixture being the only photoluminescent mixture to be introduced on the light-emitting diode package and capable of absorbing a portion of light of the first wavelength range emitted from the light-emitting chip to re-emit light of a second wavelength range;

partially curing the photoluminescent mixture by heating the photoluminescent mixture to a pre-curing temperature and then cooling the photoluminescent mixture to below the pre-curing temperature; and, thereafter, fully curing the photoluminescent mixture to harden the photoluminescent mixture, wherein the step of partially curing the photoluminescent mixture by heating the photoluminescent mixture to the pre-curing temperature comprises conveying the light-emitting diode package across a first heating zone, so that the photoluminescent mixture of the light-emitting diode package is heated to the pre-curing temperature as light-emitting diode package is being conveyed across the first heating zone, and wherein the method further comprises the steps of:

storing a plurality of carriers in a storage device, each carrier having a plurality of the light-emitting chips with partially cured photoluminescent mixtures; and heating the storage device with the plurality of carriers to fully cure the partially cured photoluminescent mixtures.

2. The method of claim 1, wherein the step of heating the photoluminescent mixture to the pre-curing temperature comprising heating the photoluminescent mixture at a rate of between 0.1° C./s and 15° C./s.

3. The method of claim 1, wherein the step of partially curing the photoluminescent mixture further comprises conveying the light-emitting diode package from the first heating zone to a second heating zone after the photoluminescent mixture is heated to the pre-curing temperature, so that the photoluminescent mixture of the light-emitting diode package is maintained at the pre-curing temperature for a first period of time as the light-emitting diode package is being conveyed across the second heating zone.

4. The method of claim 3, wherein the step of partially curing the photoluminescent mixture further comprises conveying the light-emitting diode package from the second heating zone to a third heating zone after the photoluminescent mixture is maintained at the pre-curing temperature for the first period of time, so that the photoluminescent mixture of the light-emitting diode package is heated to a second pre-curing temperature as the light-emitting diode package is being conveyed across the third heating zone.

5. The method of claim 4, wherein the step of heating the photoluminescent mixture to the second pre-curing temperature comprises heating the photoluminescent mixture at a rate of between 0.1° C./s and 15° C./s.

6. The method of claim 5, wherein the step of partially curing the photoluminescent mixture further comprises conveying the light-emitting diode package from the third heating zone to a fourth heating zone after the photoluminescent mixture is heated to the second pre-curing temperature, so that the photoluminescent mixture of the light-emitting diode package is maintained at the second pre-curing temperature as the light-emitting diode package is being conveyed across the fourth heating zone.

7. An apparatus configured to fabricate a light-emitting diode package, the light-emitting diode package comprising a light-emitting chip operative to emit light of a first wavelength range, the apparatus comprising:

a dispenser configured to dispense a photoluminescent mixture on the light-emitting chip, the photoluminescent mixture being capable of absorbing a portion of light of the first wavelength range emitted by the light-emitting chip to re-emit light of a second wavelength range;

a first heating device configured to partially cure the photoluminescent mixture; and a second heating device configured to fully cure the partially cured photoluminescent mixture to harden the photoluminescent mixture, wherein the first heating device comprises a first heating zone; and a conveying device configured and operative to convey the light-emitting diode package across the first heating zone, so that the photoluminescent mixture of the light-emitting diode package is heated to the pre-curing temperature as light-emitting diode package is being conveyed by the conveying device across the first heating zone, wherein the apparatus further comprises:

a storage device for storing a plurality of carriers, each carrier having a plurality of the light-emitting diode packages with partially cured photoluminescent mixtures, and wherein the second heating device is operable to heat the storage device to fully cure the partially cured photoluminescent mixtures.

8. The apparatus of claim 7, wherein the first heating device further comprises a plurality of respective zones for maintaining the photoluminescent mixture at the pre-curing temperature, and for cooling the photoluminescent mixture to below the pre-curing temperature, and the conveying device is configured and operative to convey the light-emitting diode package across the respective zones, so that the photoluminescent mixture of the light-emitting diode package is maintained at the pre-curing temperature and cooled to below the pre-curing temperature as the light-emitting diode package is being conveyed across the respective zones.

9. The apparatus of claim 7, wherein the first heating zone is operative to heat the photoluminescent mixture to a first pre-curing temperature at a rate of between 0.1° C./s and 15° C./s.

10. The apparatus of claim 9, wherein the first pre-curing temperature is between 80° C. and 130° C.

11. The apparatus of claim 9, wherein the first heating device comprises a second heating zone which is operative to maintain the photoluminescent mixture at the first pre-curing temperature for a first period of time after the photoluminescent mixture is heated to the first pre-curing temperature, and the conveying device is configured and operative to convey the light-emitting diode package across the second heating zone, so that the photoluminescent mixture of the light-emitting diode package is maintained at the first pre-curing temperature as the light-emitting diode package is being conveyed across the second heating zone.

12. The apparatus of claim 11, wherein the first heating device comprises a third heating zone which is operative to heat the photoluminescent mixture to a second pre-curing temperature after the photoluminescent mixture is maintained at the first pre-curing temperature for the first period of time, and the conveying device is configured and operative to convey the light-emitting diode package across the third heating zone, so that the photoluminescent mixture of the light-emitting diode package is heated to the second pre-curing temperature as the light-emitting diode package is being conveyed across the third heating zone.

13. The apparatus of claim 12, wherein the third heating zone is operative to heat the photoluminescent mixture to the second pre-curing temperature at a rate of between 0.1° C./s and 15° C./s.

14. The apparatus of claim 13, wherein the second pre-curing temperature is between 100° C. and 130° C.

15. The apparatus of claim 13, wherein the first heating device comprises a fourth heating zone which is operative to maintain the photoluminescent mixture at the second pre-curing temperature for a second period of time after the photoluminescent mixture is heated to the second pre-curing temperature, and the conveying device is configured and operative to convey the light-emitting diode package across the fourth heating zone, so that the photoluminescent mixture of the light-emitting diode package is maintained at the second pre-curing temperature as the light-emitting diode package is being conveyed across the fourth heating zone.

16. The apparatus of claim 15, wherein the first heating device comprises a cooling zone which is operative to cool the photoluminescent mixture to below the second pre-curing temperature after the photoluminescent mixture is maintained at the second pre-curing temperature for the second period of time, and the conveying device is configured and operative to convey the light-emitting diode package across the cooling zone, so that the photoluminescent mixture of the light-emitting diode package is cooled to below the second pre-curing temperature as the light-emitting diode package is being conveyed across the cooling zone.

17. The method of claim 1, wherein the first heating zone comprises a temperature that is higher than the pre-curing temperature, in order to heat the photoluminescent mixture of the light-emitting package to the pre-curing temperature.

18. The apparatus of claim 7, wherein the first heating zone comprises a temperature that is higher than the pre-curing temperature, in order to heat the photoluminescent mixture of the light-emitting package to the pre-curing temperature.

* * * * *